US009761481B2

(12) United States Patent
Wong et al.

(10) Patent No.: US 9,761,481 B2
(45) Date of Patent: Sep. 12, 2017

(54) INTEGRATED CIRCUITS AND METHODS OF FORMING THE SAME WITH METAL LAYER CONNECTION TO THROUGH-SEMICONDUCTOR VIA

(71) Applicant: GLOBALFOUNDRIES, Inc., Grand Cayman (KY)

(72) Inventors: Chun Yu Wong, Ballston Lake, NY (US); Sarasvathi Thangaraju, Malta, NY (US); Percival Rayo, Singapore (SG)

(73) Assignee: GLOBALFOUNDRIES, INC., Grand Cayman (KY)

( * ) Notice: Subject to any disclaimer, the term of this patent is extended or adjusted under 35 U.S.C. 154(b) by 213 days.

(21) Appl. No.: 13/748,159

(22) Filed: Jan. 23, 2013

(65) Prior Publication Data

US 2014/0203449 A1    Jul. 24, 2014

(51) Int. Cl.
*H01L 21/768*     (2006.01)
*H01L 23/528*     (2006.01)

(52) U.S. Cl.
CPC .. *H01L 21/76807* (2013.01); *H01L 21/76898* (2013.01); *H01L 23/528* (2013.01); *H01L 23/5286* (2013.01); *H01L 2924/0002* (2013.01)

(58) Field of Classification Search
CPC ......... H01L 21/76898; H01L 21/76849; H01L 23/481; H01L 23/5329; H01L 21/76807; H01L 23/528; H01L 23/5283
USPC .......... 257/774, 750, E21.597; 438/622, 637
See application file for complete search history.

(56) References Cited

U.S. PATENT DOCUMENTS

| 2010/0032764 | A1* | 2/2010 | Andry et al. ................ 257/369 |
| 2011/0316168 | A1* | 12/2011 | Moon ................ H01L 23/481 257/774 |
| 2012/0326320 | A1* | 12/2012 | Hong ................ H01L 21/76898 257/770 |
| 2013/0285125 | A1* | 10/2013 | Chen .................... H01L 24/13 257/288 |

OTHER PUBLICATIONS

"Reliability Studies of a Through Via Silicon Stacked Module for 3D Microsystem Packaging", 2006 IEEE.*

* cited by examiner

*Primary Examiner* — Eva Y Montalvo
*Assistant Examiner* — Nga Doan
(74) *Attorney, Agent, or Firm* — Lorenz & Kopf, LLP

(57) ABSTRACT

Integrated circuits and methods of forming integrated circuits are provided herein, in which a plurality of semiconductor devices is formed on a semiconductor substrate. At least one through-semiconductor via is formed in the semiconductor substrate and an interlayer dielectric layer is formed overlying the at least one through-semiconductor via and the plurality of semiconductor devices. A first pattern is etched in the interlayer dielectric layer over the at least one through-semiconductor via, and a second pattern different from the first pattern is etched in the interlayer dielectric layer over the same through-semiconductor via as the first pattern. At least one interconnect via is embedded within the interlayer dielectric layer, in electrical communication with one of the at least one through-semiconductor vias. A metal-containing material is deposited in the first pattern and the second pattern to form a first metal layer in electrical communication with the at least one interconnect via.

7 Claims, 9 Drawing Sheets

INTEGRATED CIRCUITS AND METHODS OF FORMING THE SAME WITH METAL LAYER CONNECTION TO THROUGH-SEMICONDUCTOR VIA

TECHNICAL FIELD

The present invention generally relates to integrated circuits and methods of forming integrated circuits, and more particularly relates to integrated circuits and methods of forming integrated circuits with a metal layer in electrical communication to at least one through-semiconductor via.

BACKGROUND

During a front end-of-the-line (FEOL) semiconductor fabrication process, a plurality of semiconductor devices (e.g., transistors, resistors, and the like) is generally formed on a semiconductor substrate. During a back end-of-the-line (BEOL) semiconductor fabrication process, the semiconductor devices are connected by a network of electrically-conductive lines, vias, and interconnect structures. The network of electrically-conductive lines, vias, and interconnect structures selectively connect the semiconductor devices to each other and to various other devices such as, but not limited to, a power source, clocks, signals, addresses, and input and output sources, and also connect the semiconductor devices to subsequently-formed semiconductor devices. In this manner, a plurality of integrated circuits (ICs) is formed on the semiconductor substrate with electrical connection enabled through the network of electrically-conductive lines, vias, and interconnect structures.

To enable efficient interconnection of the semiconductor devices to each other and to a power source, electrically-conductive vias are integrally formed within the semiconductor substrate and extend across various levels of integrated circuits to provide power to the different levels. Such electrically-conductive vias are known in the art as through-semiconductor vias. The through-semiconductor vias are formed during the BEOL semiconductor fabrication process by selectively etching a recess through any dielectric layers that overlie the semiconductor substrate and at least partially into the semiconductor substrate, followed by depositing metal such as copper in the recess and chemical-mechanical planarization (CMP) to remove excess metal from outside of the recess. Subsequent layers are then formed over the dielectric layers and the through-semiconductor via, including a metal layer that selectively connects the through-semiconductor vias to a power source and to the semiconductor devices.

Void formation is a common problem associated with forming subsequent layers over the through-semiconductor via. Without being bound to any particular theory, it is believed that void formation is attributable to migration of metal ions from the through-semiconductor vias into the interface between the through-semiconductor vias and the metal layer or dielectric layers that overlie the through-semiconductor vias. It is believed that the migration of the metal ions causes stress-induced warping in the subsequent layers, thereby creating voids between the through-semiconductor vias and the metal layer that overlies the through-semiconductor vias. As a result of void formation, connections between the through-semiconductor vias and the subsequent layers may be compromised at various locations, resulting in loss of electrical communication between the through-semiconductor vias and the subsequent metal layer that overlies the through-semiconductor vias.

In addition to void formation between through-semiconductor vias and subsequent layers being a common problem, robust connection between subsequently-formed metal layers and the through-semiconductor vias presents difficulties, especially as feature dimensions continually shrink. Ineffective etching and fragile pattern features correlate to higher rates of defect formation in the integrated circuits. In particular, ineffective etching may result as pattern features (in particular, gaps or recesses in the pattern) become so small that intended sites of recess formation are missed. Further, fragile pattern features may be broken during various processing techniques such as CMP or etching.

Accordingly, it is desirable to provide integrated circuits and methods of forming integrated circuits that minimize or alleviate void formation between through-semiconductor vias and subsequent layers that overlie the through-semiconductor vias. It is also desirable to provide methods of forming integrated circuits that minimize the incidence of defect formation in connection with ineffective etching and fragile pattern features. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits and methods of forming integrated circuits are provided herein. In an embodiment of a method of forming an integrated circuit, a plurality of semiconductor devices is formed on a semiconductor substrate. At least one through-semiconductor via is formed in the semiconductor substrate and an interlayer dielectric layer is formed overlying the at least one through-semiconductor via and the plurality of semiconductor devices. A first pattern is etched in the interlayer dielectric layer over the at least one through-semiconductor via, and a second pattern that is different from the first pattern is etched in the interlayer dielectric layer over the at least one through-semiconductor via. The first pattern and the second pattern are etched over the same through-semiconductor via. At least one interconnect via is embedded within the interlayer dielectric layer, and the at least one interconnect via is in electrical communication with one of the at least one through-semiconductor vias. A metal-containing material is deposited in the first pattern and the second pattern to form a first metal layer in electrical communication with the at least one interconnect via.

In another embodiment, a method of forming an integrated circuit includes forming a plurality of semiconductor devices on a semiconductor substrate. At least one via hole is etched into the semiconductor substrate with the semiconductor substrate surrounding the at least one via hole, and with the at least one semiconductor device formed adjacent the at least one via hole. At least one through-semiconductor via is formed in the at least one via hole in the semiconductor substrate. An interlayer dielectric layer is formed overlying the at least one through-semiconductor via and the plurality of semiconductor devices. A first pattern is etched in the interlayer dielectric layer over the at least one through-semiconductor via, and a second pattern that is different from the first pattern is etched in the interlayer dielectric layer over the at least one through-semiconductor via. The first pattern and the second pattern are etched over the same through-semiconductor via. At least one interconnect hole is etched through the interlayer dielectric layer in at least one of the first pattern or the second pattern. The at least one interconnect hole is filled with a metal-containing material to form a plurality of interconnect vias and the metal-containing material is deposited in the first pattern and the second pattern, concurrent with filling the at least one interconnect hole, to form a first metal layer in electrical communication with the plurality of interconnect vias. The plurality of interconnect vias is in electrical communication with one of the at least one through-semiconductor vias.

In another embodiment, an integrated circuit includes a semiconductor substrate and a plurality of semiconductor devices disposed on the semiconductor substrate. At least one through-semiconductor via is disposed in the semiconductor substrate. An interlayer dielectric layer overlies the at least one through-semiconductor via and the plurality of semiconductor devices. A plurality of interconnect vias is embedded within the interlayer dielectric layer, and the plurality of interconnect vias is in electrical communication with one of the at least one through-semiconductor vias. A first metal layer is in electrical communication with the plurality of interconnect vias. A first pattern and a second pattern are defined in the interlayer dielectric layer with the first metal layer disposed in the first pattern and the second pattern. Dielectric material of the interlayer dielectric layer separates the first metal layer in the first pattern from the first metal layer in the second pattern.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Integrated circuits and methods of forming integrated circuits are provided herein. The integrated circuits include a semiconductor substrate having a plurality of semiconductor devices formed thereon, with at least one through-semiconductor via formed in the semiconductor substrate for supplying electricity through various layers of the integrated circuit. An interlayer dielectric layer is formed overlying the at least one through-semiconductor via and the plurality of semiconductor devices, and at least one interconnect via is embedded within the interlayer dielectric layer with the at least one interconnect via in electrical communication with the at least one through-semiconductor via. In accordance with the methods of forming the integrated circuits as described herein, a patterning technique is employed with a first pattern etched in the interlayer dielectric layer over the at least one through-semiconductor via, and a second pattern different from the first pattern is etched in the interlayer dielectric layer over the at least one through-semiconductor via, with the first pattern and the second pattern etched over the same through-semiconductor via. The first pattern and the second pattern can be etched in a variety of different configurations that all result in alleviating the incidence of defect formation attributable to ineffective etching and fragile pattern features. In particular, in various embodiments that are described in further detail below, the first pattern and the second pattern can be complementary to enable nanometer-scale pattern features to be achieved without attendant difficulties that are associated with a single pattern that includes all of the pattern features; the first pattern and the second pattern can overlap to ensure that portions of the interlayer dielectric layer are sufficiently etched to enable proper formation of interconnect vias and connection of the interconnect vias to a subsequently-formed metal layer; and/or the first pattern and the second pattern can be formed in different regions over the through-semiconductor via to provide flexible etching options in different regions of the interlayer dielectric layer.

Figure 1:
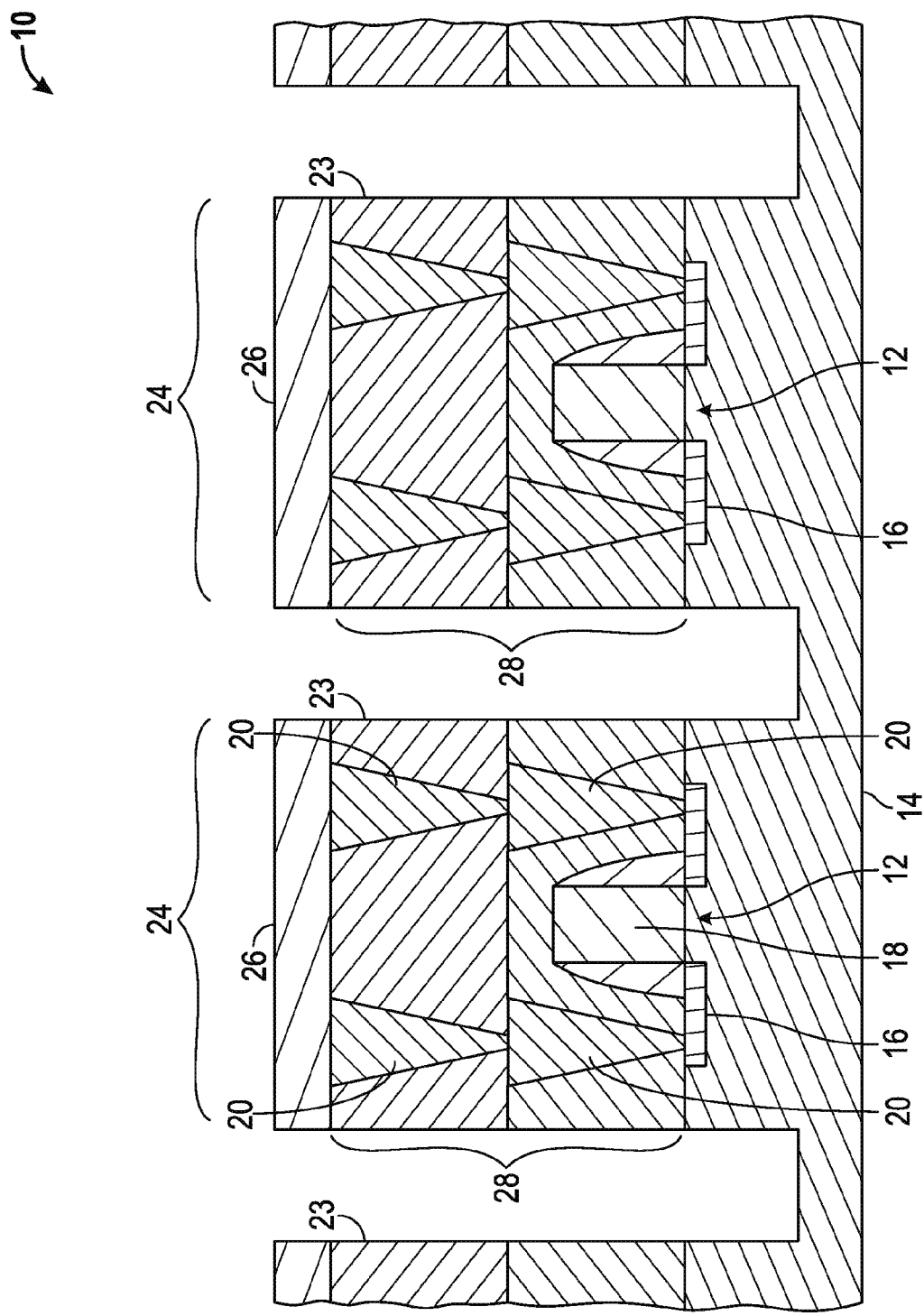
FIG. 1 is a schematic cross-sectional side view of a portion of an integrated circuit including a semiconductor substrate and transistors formed on the semiconductor substrate, with via holes for through-semiconductor vias formed in the integrated circuit.
Figure 4:
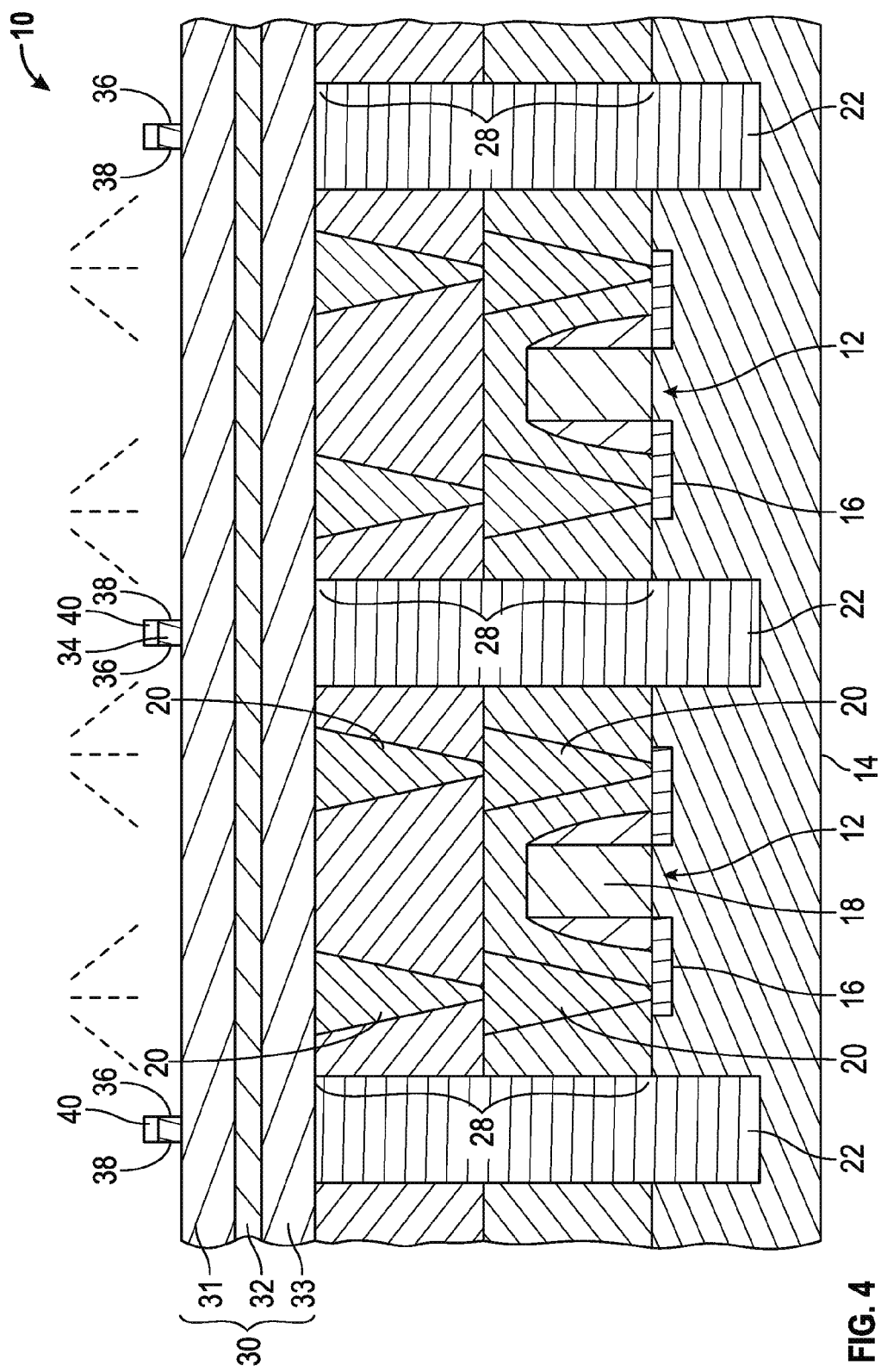
FIG. 4 is a schematic cross-sectional side view of the portion of the integrated circuit as shown in FIG. 3, illustrating concurrent etching of the interlayer dielectric layer to form a first pattern and a second pattern in the interlayer dielectric layer through gaps in the resist film.
Figure 5:
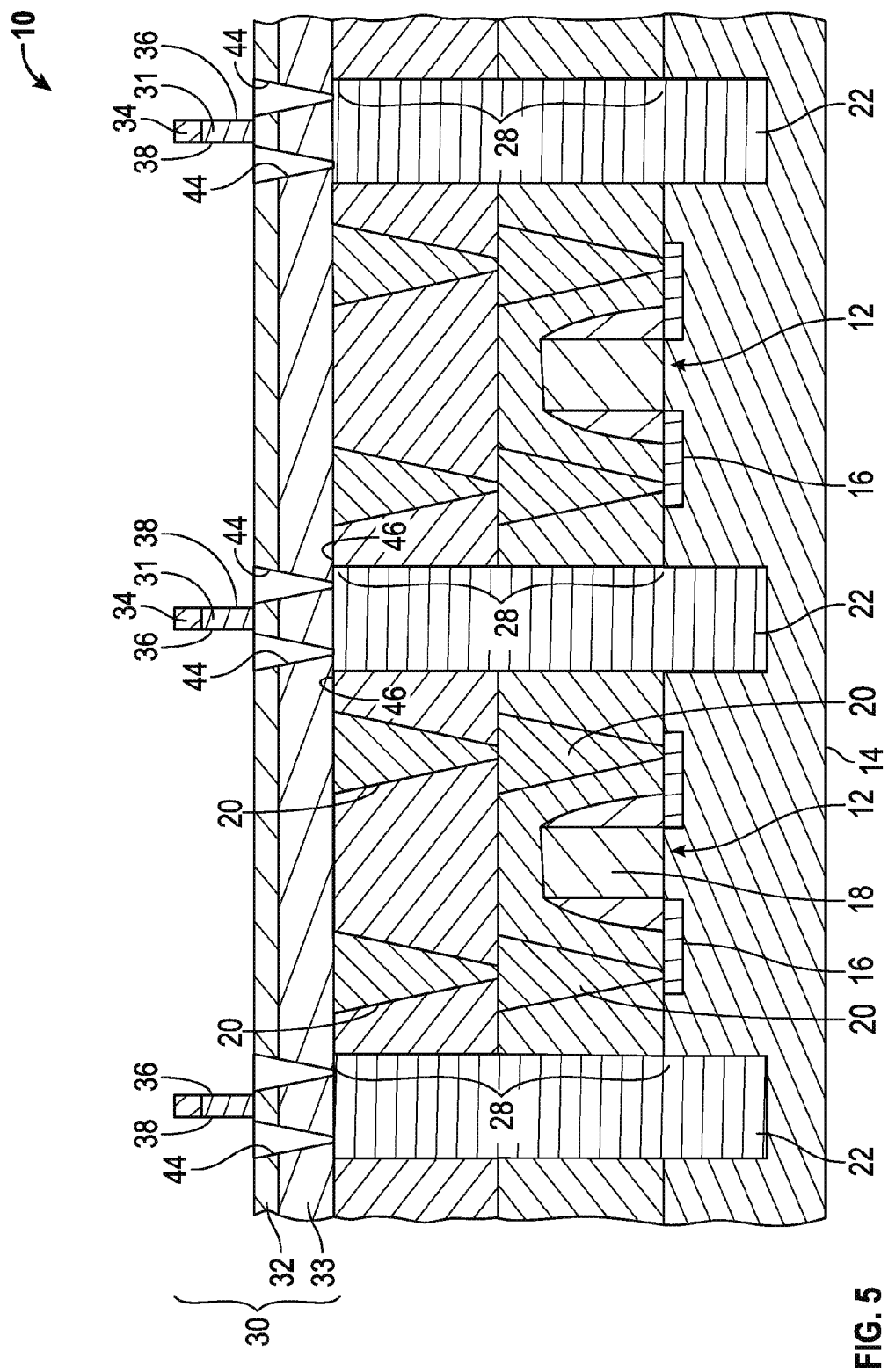
FIG. 5 is a schematic cross-sectional side view of the portion of the integrated circuit as shown in FIG. 4, illustrating the first pattern and the second pattern in the interlayer dielectric layer and further illustrating interconnect holes formed in the first pattern and the second pattern.
Figure 6:
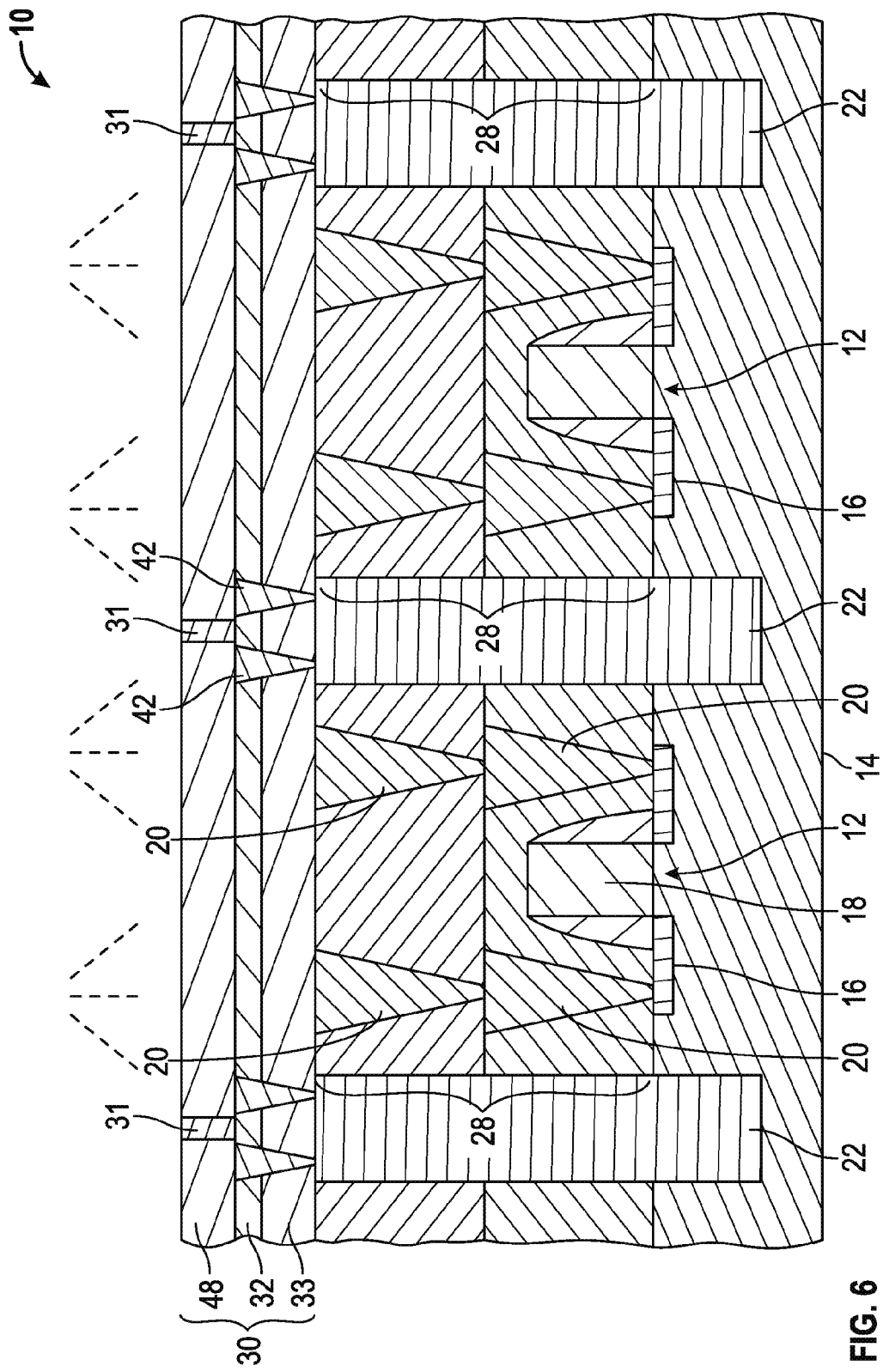
FIG. 6 is a schematic cross-sectional side view of the portion of the integrated circuit as shown in FIG. 5 after filling the first pattern, the second pattern, and the interconnect holes with electrically-conductive material to form a first metal layer and interconnect vias, respectively.

Referring to FIGS. 1-6, an embodiment of an integrated circuit 10 and a method of forming the integrated circuit 10 will now be described, with FIG. 6 showing the integrated circuit 10 that is formed in accordance with the method as shown sequentially in FIGS. 1-5. Referring now to FIG. 1, a plurality of semiconductor devices 12 is formed on a semiconductor substrate 14, and the semiconductor devices 12 are present in the resulting integrated circuit 10 as shown in FIG. 6. The semiconductor substrate 14, as referred to herein, includes semiconductor material such as any group IV semiconductor material. Examples of suitable semiconductor materials include, but are not limited to, those chosen from silicon, silicon germanium (SiGe), germanium (Ge), gallium arsenide (GaAs), or indium phosphide (InP). For example, in an embodiment, the semiconductor material is a silicon-containing material, such as mono- or poly-crystalline silicon, and the semiconductor substrate 14 may contain one or more doped regions 16 of the silicon-containing material. In FIG. 1, the semiconductor substrate 14 is shown as a base substrate with no further structure beneath the semiconductor substrate 14; however, although not shown, it is to be appreciated that the semiconductor substrate 14 can be an intermediate substrate within a stack of alternating layers produced through front-end-of-line (FEOL) fabrication and back-end-of-line (BEOL) fabrication techniques to form the integrated circuit 10. The semiconductor devices 12 include, but are not limited to, transistors, capacitors, resistors, or the like. In an embodiment, the semiconductor devices 12 are transistors that include a gate electrode 18 with embedded electrical contacts 20 that provide electrical connections on opposite sides of the gate electrode 18. A dielectric layer 28 is formed overlying the semiconductor substrate 14, gate electrode 18, and the embedded electrical contacts 20 are formed in the dielectric layer 28 through techniques known in the art.

Figure 2:
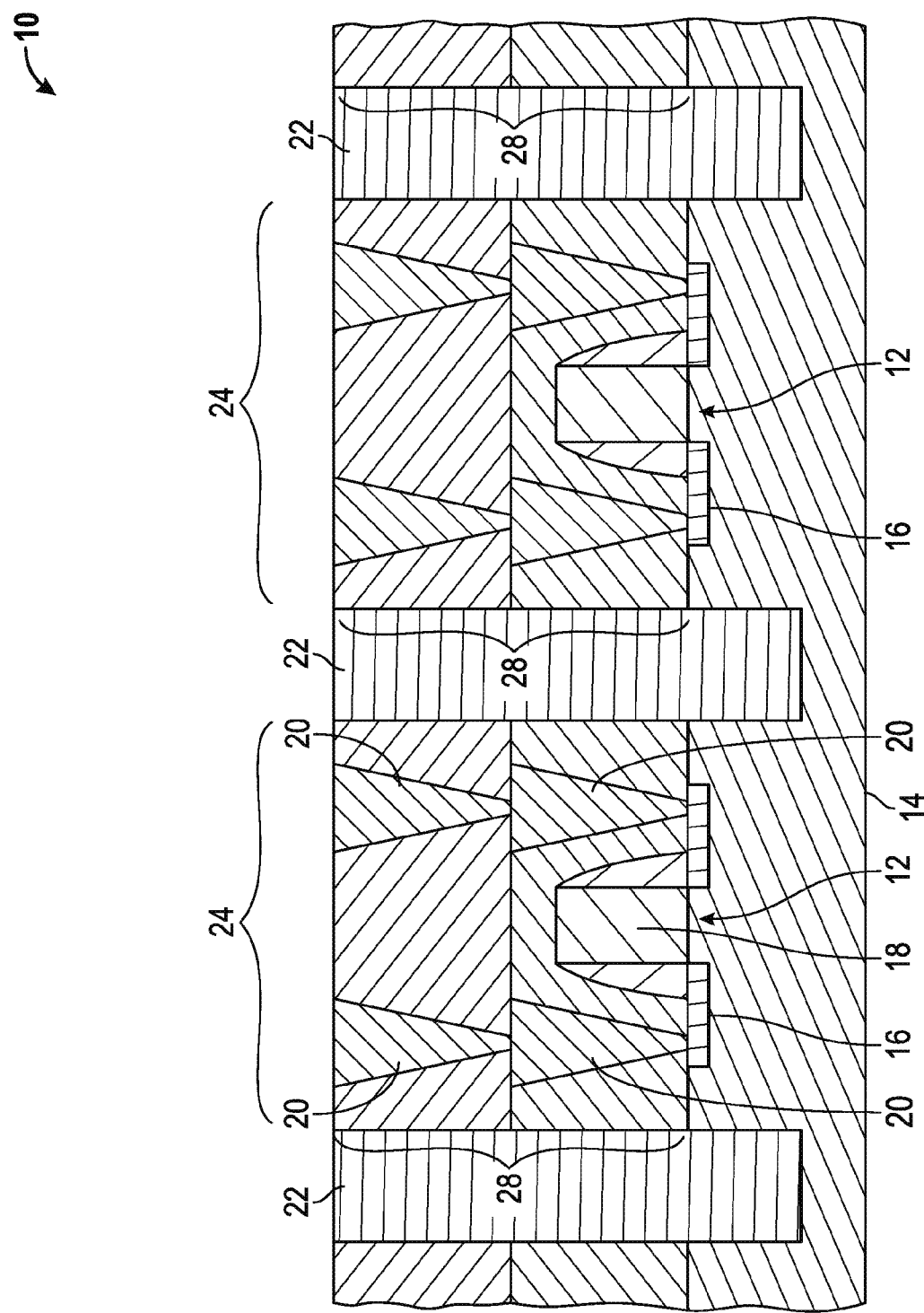
FIG. 2 is a schematic cross-sectional side view of the portion of the integrated circuit as shown in FIG. 1, with through-semiconductor vias formed in the via holes.

As shown in FIG. 2, at least one through-semiconductor via 22 is formed in the semiconductor substrate 14, with the at least one through-semiconductor via 22 disposed in the semiconductor substrate 14 of the resulting integrated circuit 10 as shown in FIG. 6. In an embodiment and as shown in FIG. 2, a plurality of through-semiconductor vias 22 is formed in the semiconductor substrate 14 with the semiconductor substrate 14 surrounding the through-semiconductor vias 22, with regions 24 of the semiconductor substrate 14 that are adjacent to the through-semiconductor vias 22 having at least one semiconductor device 12 formed thereon. The through-semiconductor vias 22 at least partially extend into the semiconductor substrate 14, and generally extend completely through the semiconductor substrate 14, to clearly define the regions 24 of the semiconductor substrate 14 that are adjacent to the through-semiconductor vias 22. As such, it is to be appreciated that "through-semiconductor", as the phase is used herein, does not necessarily require that the at least one through-semiconductor via 22 extends completely through the semiconductor substrate 14.

The at least one through-semiconductor via 22 includes an electrically-conductive material such as, but not limited to, metals including copper, tungsten, aluminum, silver, gold, other metals, or alloys thereof. The at least one through-semiconductor via 22 enables semiconductor devices 12 in different levels of the integrated circuit 10 to be connected to a power source (not shown), with the at least one through-semiconductor via 22 embedded directly within the integrated circuit 10 as an alternative to a wiring scheme that is external to the integrated circuit 10. The at least one through-semiconductor via 22 enables the integrated circuits 10 to be scaled down without sacrificing robust electrical connections between the semiconductor devices 12 and the power source, and further provides manufacturing efficiencies by avoiding the need for separate wiring schemes to be implemented after forming the integrated circuits 10.

In an embodiment, the at least one through-semiconductor via 22 is formed by etching at least one via hole 23 into the semiconductor substrate 14, including through any dielectric layers 28 that overlie the semiconductor devices 12, to form the regions 24 of the semiconductor substrate 14 that are adjacent to the at least one via hole 23. In an embodiment and as shown in FIG. 1, a protecting layer 26 of dielectric material is formed over dielectric layers 28 that overlie the semiconductor devices 12, with the protecting layer 26 including dielectric material that has a materially different etch rate in particular etchants than the dielectric layer 28 that is immediately beneath the protecting layer 26. By "materially different", it is meant that an etchant and etching technique that is effective to etch one of the layers etches another of the layers at a rate that is measurably slower, such as at least 50 percent slower. The protecting layer 26 thus functions as a hard mask, whereby the protecting layer 26 is patterned with the pattern in the protecting layer 26 transferred to underlying dielectric layers 28. In further detail, known techniques can be employed that utilize printing to pattern a resist film (not shown) over the protecting layer 26, with the resist film patterned with a desired configuration of the at least one via hole 23, followed by etching the protecting layer 26 through the pattern in the resist film with an appropriate etchant that preferentially etches the protecting layer 26 to transfer the pattern in the resist film into the protecting layer 26. Once the pattern is transferred into the protecting layer 26, an appropriate etchant is employed to etch the dielectric layers 28 that overlie the semiconductor devices 12 through the pattern in the protecting layer 26. In one example, the protecting layer 26 includes a nitrogen-containing silicon material such as nitrogen-doped silicon carbide or Si—N—C—H (NBLoK), and the dielectric layer 28 that is immediately beneath the protecting layer 26 includes an oxide such as silicon dioxide, with known etchants employed for etching that preferentially etch the nitrogen-containing silicon material and the oxide. Suitable etchants for nitrogen-containing silicon material include, but art not limited to, $CHF_3/O_2$ mixtures, and etching of the protecting layer 26 can be conducted through dry etching techniques. Suitable etchants for oxides are well known, and etching of the dielectric layer 28 that is immediately beneath the protecting layer 26 may be conducted through wet etching techniques. The semiconductor substrate 14 may then be etched to form the at least one via hole 23 through known etching techniques, such as isotropic etching using SF6 and C4F8. It is to be appreciated that various configurations of dielectric layers 28 overlying the semiconductor devices 12 can be employed, and various materials can be used for the protecting layer 26 and the dielectric layer 28 that overlies the semiconductor devices 12, with differences in etch rates between the materials exploited to preferentially etch the via holes in a uniform manner. As referred to herein, the term "dielectric layer" encompasses one or more individual dielectric layers that overlie the semiconductor devices 12. For example, although two individual layers are shown in the dielectric layer 28 overlying the semiconductor devices 12, it is to be appreciated that the dielectric layer 28 may include a single layer (not shown). Alternatively, more than two individual layers can be present in the dielectric layer 28 in other embodiments, depending upon particular architecture of the semiconductor devices 12 and electrical connections to the semiconductor devices 12.

Referring to FIG. 2, the at least one through-semiconductor via 22 is formed in the at least one via hole in the semiconductor substrate 14, such as through deposition of electrically-conductive material in the at least one via hole while the protecting layer is still in place followed by chemical-mechanical planarization (CMP) of the protecting layer and excess electrically-conductive material that is outside of the at least one via hole. The protecting layer and excess electrically-conductive material that is outside of the at least one via hole is removed through CMP, thereby leaving the structure as shown in FIG. 2.

Figure 3:
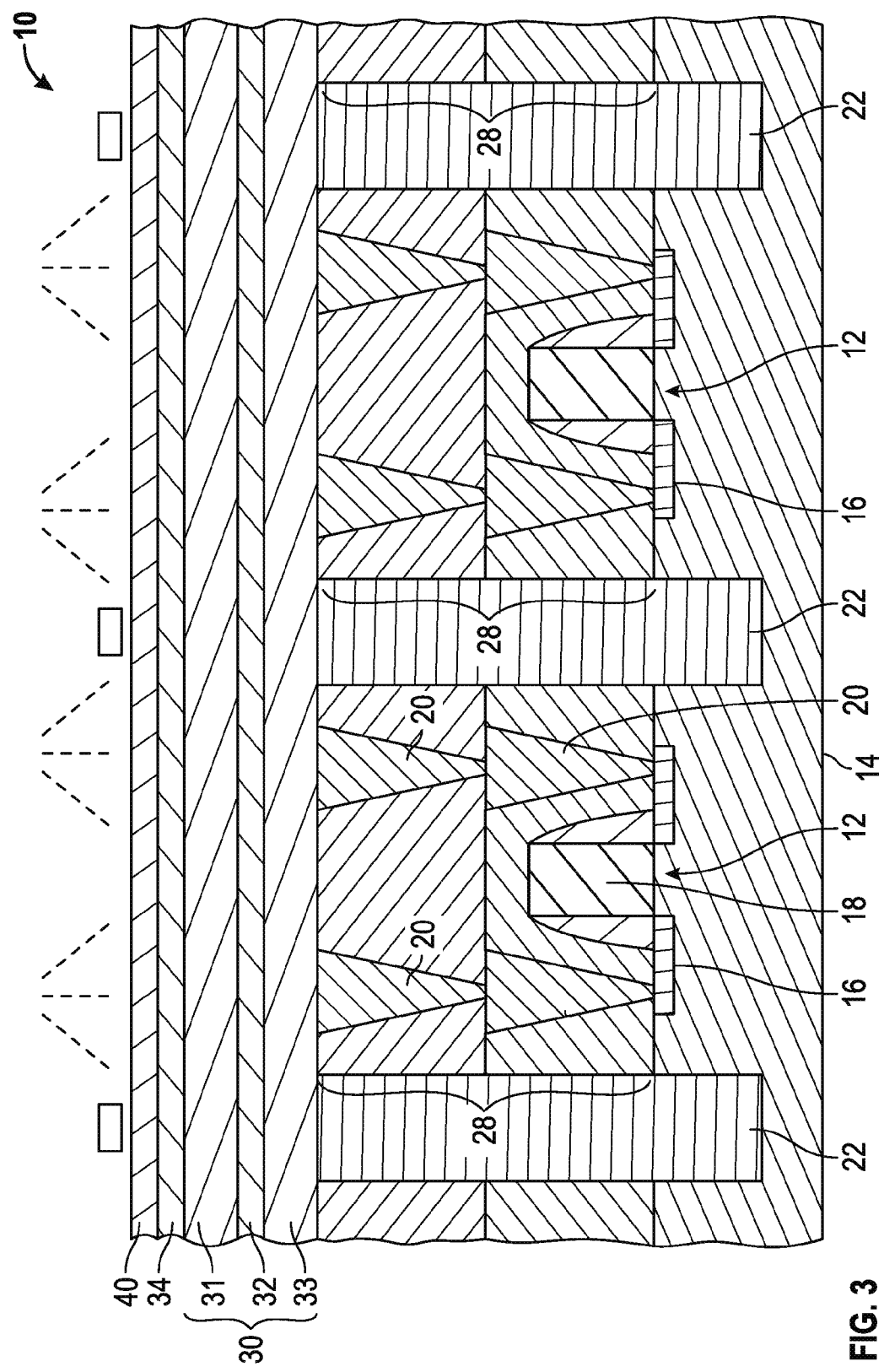
FIG. 3 is a schematic cross-sectional side view of the portion of the integrated circuit as shown in FIG. 2, with an interlayer dielectric layer formed overlying the through-semiconductor vias and the transistors, illustrating printing of a resist film over the interlayer dielectric layer.

Referring to FIG. 3, after forming the at least one through-semiconductor via 22 in the semiconductor substrate 14, an interlayer dielectric layer 30 is formed overlying the at least one through-semiconductor via 22 and the plurality of semiconductor devices 12. More particularly, the interlayer dielectric layer 30 is formed overlying the at least one through-semiconductor via 22 and any dielectric layers 28 that overlie the semiconductor devices 12 and that remain after forming the at least one through-semiconductor via 22 (i.e., dielectric layers 28 that are formed during the FEOL fabrication). For purposes of the instant application, the "interlayer dielectric layer" refers to a layer or layers of dielectric material that are formed during BEOL fabrication and that at least partially remain in the integrated circuit 10 after fabrication. It is to be appreciated that separate layers 31, 32, 33 of different dielectric material can be present in the structure referred to herein as the "interlayer dielectric layer", or the interlayer dielectric layer 30 can include only a single layer (not shown). For example in an embodiment, as shown in FIG. 3, the interlayer dielectric layer 30 includes a combination of separate layers 31, 32, 33 that include different dielectric materials that have materially different etch rates in different etchants for purposes of selectively etching the interlayer dielectric layer 30 in the same manner as described above in the context of forming the at least one through-semiconductor via 22. It is also to be appreciated that, during fabrication, additional layers of dielectric material may be formed that are subsequently completely removed during fabrication, such as a hard mask 34 that is described in further detail below, and such additional layers are not encompassed by the "interlayer dielectric layer" as referred to herein if such layers are ultimately removed from the integrated circuit 10. It is also to be appreciated that, although not shown, one or more additional layers may also be present in layer 30, including dielectric layers and/or metal layers, and the structure shown in the Figures for the interlayer dielectric layer is not limited to only the layers 31, 32, 33 that are explicitly shown.

After the interlayer dielectric layer 30 is formed, the interlayer dielectric layer 30 is etched for purposes of forming trenches and patterns in the interlayer dielectric layer 30. In an embodiment, the interlayer dielectric layer 30 is etched in the same manner as described above for forming the through-semiconductor via 22, where the protecting layer is employed and is patterned using printing of a resist film. In accordance with the methods described herein, a first pattern 36 is etched in the interlayer dielectric layer 30 over the at least one through-semiconductor via 22, and a second pattern 38 different from the first pattern 36 is also etched in the interlayer dielectric layer 30 over the at least one through-semiconductor via 22. By etching the first pattern 36 and the second pattern 38 in the interlayer dielectric layer 30, as described in further detail below, finer pattern definition can be achieved without detriments associated with a single patterning technique. For example, by overlapping portions of the first pattern 36 and the second pattern 38, by employing complementary first patterns 36 and second patterns 38, or by forming the first pattern and the second pattern in different regions over the through-semiconductor via, details of the combined first pattern 36 and the second pattern 38 may define an intricate and robust pattern without drawbacks associated with a single patterning technique. Such intricate and robust pattern formation is particularly beneficial with ever increasing aspect ratios that are employed to fabricate integrated circuits. Ultimately, formation of the first pattern and the second pattern enables a pattern density on the first pattern and the second pattern to be maximized. Further, by formation of the first pattern and the second pattern, empty pattern regions in the first pattern and the second pattern can be minimized.

Figure 7:
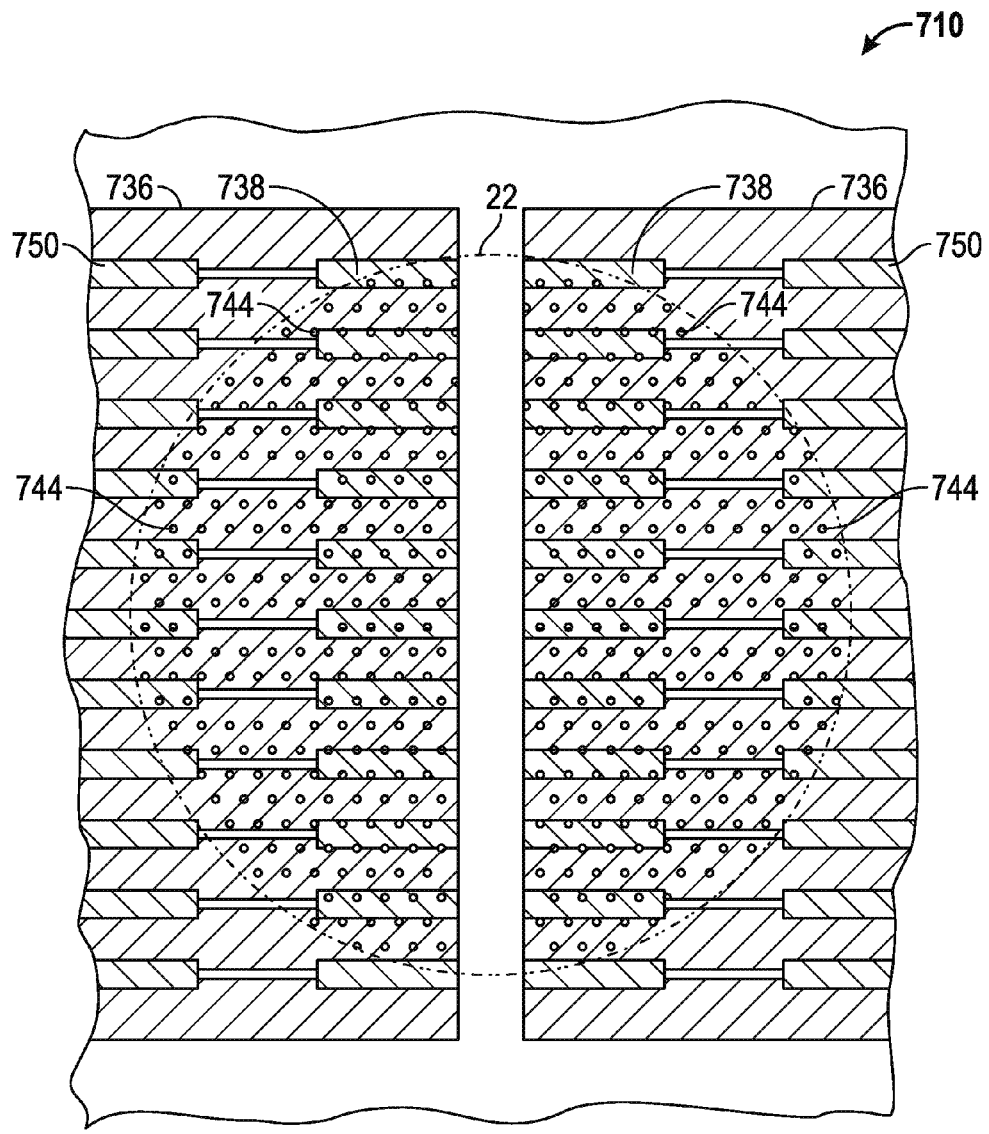
FIG. 7 is a schematic top view of an integrated circuit in accordance with an embodiment focused over a single through-semiconductor via thereof, after etching the first pattern and etching the second pattern in the interlayer dielectric layer, and also after etching interconnect holes in the interlayer dielectric layer that expose the surface of the through-semiconductor via.
Figure 8:
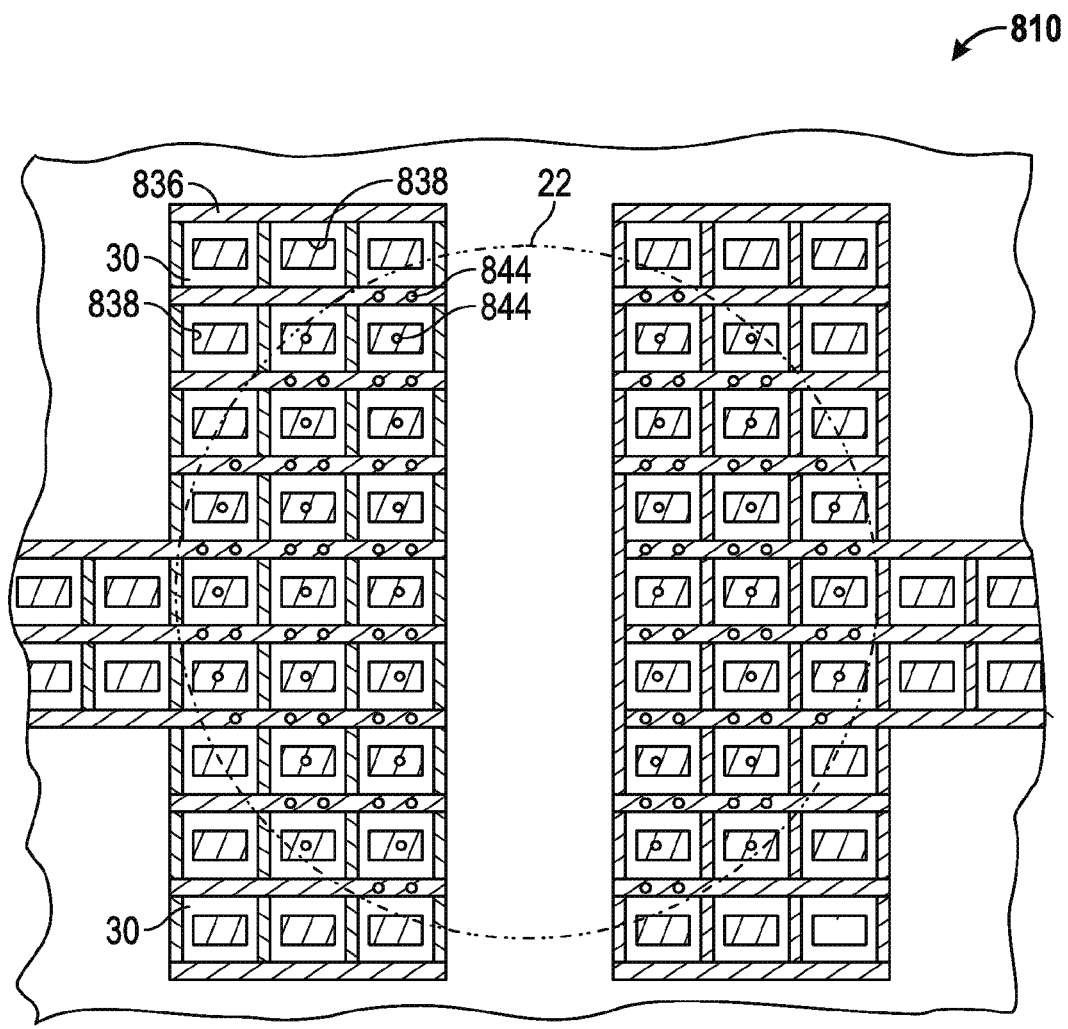
FIG. 8 is a schematic top view of an integrated circuit in accordance with another embodiment focused over a single through-semiconductor via thereof, after etching the first pattern and etching the second pattern in the interlayer dielectric layer, and also after etching interconnect holes in the interlayer dielectric layer that expose the surface of the through-semiconductor via.
Figure 9:
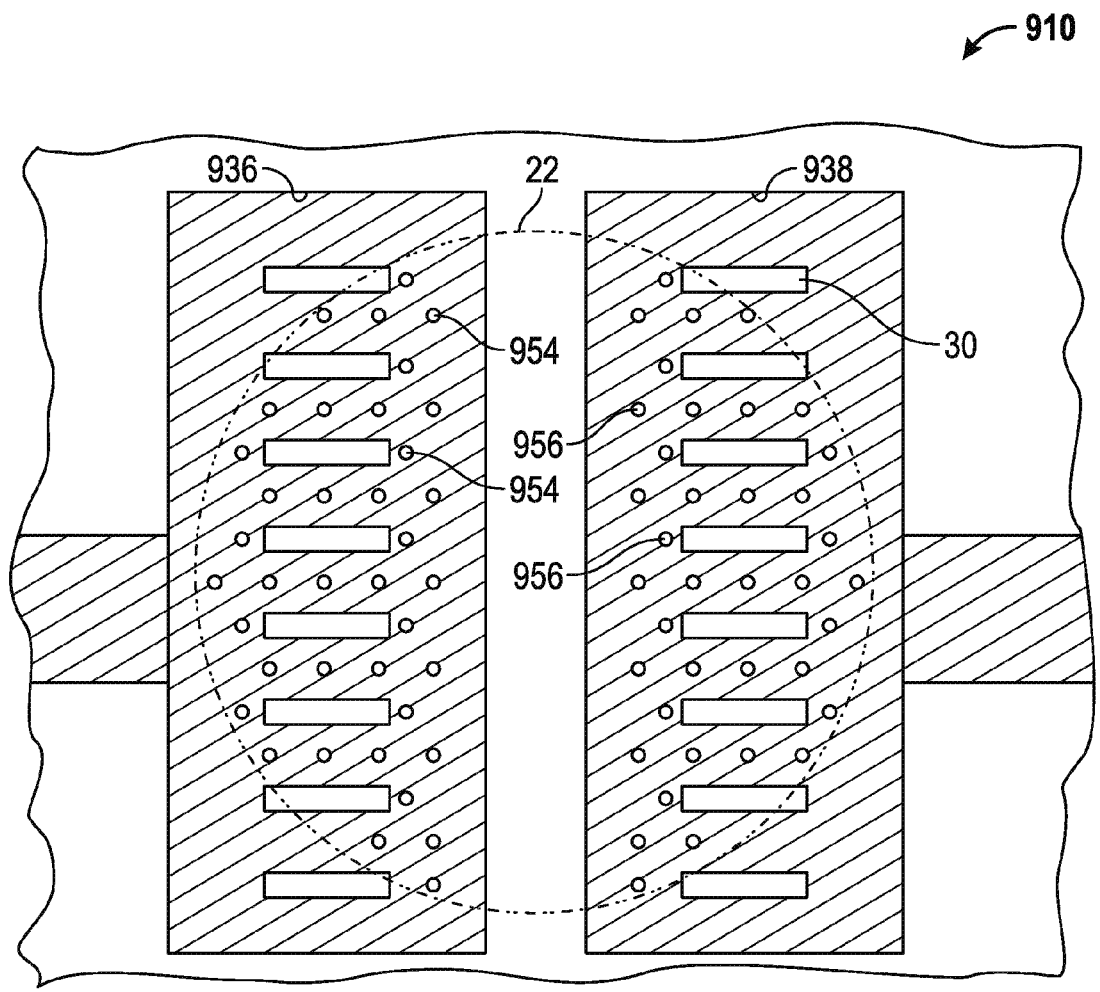
FIG. 9 is a schematic top view of an integrated circuit in accordance with another embodiment focused over a single through-semiconductor via thereof, after etching the first pattern and etching the second pattern in the interlayer dielectric layer, and also after etching interconnect holes in the interlayer dielectric layer that expose the surface of the through-semiconductor via.

In an embodiment, the first pattern 36 is first formed through printing of a resist film 40, followed by forming the second pattern 38 through printing of the same resist film 40, with simultaneous etching of the interlayer dielectric layer 30 through the first pattern 36 and the second pattern 38 in the resist film 40 to transfer the first pattern 36 and the second pattern 38 into the interlayer dielectric layer 30. It is to be appreciated that the order of patterning for the first pattern 36 and the second pattern 38 can be reversed. It is also to be appreciated that, as an alternative to simultaneous etching of the interlayer dielectric layer 30 through the first pattern 36 and the second pattern 38 in the resist film 40, separate etching techniques may be employed after printing to form the first pattern 36 in the resist film 40 and printing to form the second pattern 38 in the resist film 40. However, it is to be appreciated that suitable integration schemes are not limited to the preceding examples. For simplicity, FIG. 3 generally illustrates printing of a resist film 40 and FIG. 4 generally illustrates etching of the interlayer dielectric layer 30 after printing, although it is to be appreciated that separate cycles of printing and, optionally, etching are employed to form the first pattern 36 and the second pattern 38, respectively. In particular, the first pattern 36 and the second pattern 38 are at least separately formed during printing, with the resist film 40 being patterned in different steps to form the first pattern 36 and the second pattern 38 in the resist film 40, and with subsequent etching through gaps in the resist film 40 conducted either concurrently or in separate steps for the first pattern 36 and the second pattern 38 in the hard mask 34. For simplicity and ease of illustration, FIGS. 3 and 4 illustrate formation of the first pattern 36 and the second pattern 38 in accordance with an embodiment in which the first pattern 36 and the second pattern 38 are isolated to different regions of the through-semiconductor vias 22 (and, optionally, other regions across the interlayer dielectric layer 30 that do not overlie the through-semiconductor vias 22), although more detailed illustrations of embodiments of the first pattern 36 and the second pattern 38 are shown in FIGS. 7-9. In accordance with the methods described herein, the first pattern 36 and the second pattern 38 are etched over the same through-semiconductor via 22, and it is to be appreciated that first pattern 36 and the second pattern 38 may be etched over each of the at least one through-semiconductor vias 22.

In an embodiment, to etch the first pattern 36 and the second pattern 38 in the interlayer dielectric layer 30, a hard mask 34 (comparable to the protecting layer as described above) is formed overlying the interlayer dielectric layer 30 before forming the resist film 40. The hard mask 34 is patterned, such as by conducting printing of the resist film 40 (as generally shown in FIG. 3) in a configuration of the first pattern 36, followed by conducting printing of the resist film 40 in a configuration of the second pattern 38. The hard mask 34 is then etched to form a first hard mask pattern in a configuration of the first pattern 36 and a second hard mask pattern in the configuration of the second pattern 38. Portions of the hard mask 34 that remain after etching are generally shown in FIG. 4. In an embodiment, material of the hard mask 34 is substantially resistant to etchants that are effective for etching the interlayer dielectric layer 30, or an individual layer 31 thereof that is immediately beneath the hard mask 34, and the hard mask 34 is not completely removed during etching of the interlayer dielectric layer 30 such that the hard mask 34 is effective for maintaining the shape of the first pattern 36 and the second pattern 38 during etching of the interlayer dielectric layer 30. In an embodiment, the hard mask 34 includes metal, although it is to be appreciated that other known materials for hard masks can also be used and the hard masks described herein are not limited to any particular material. However, it is to be appreciated that suitable integration schemes are not limited to the preceding examples.

In an embodiment, and as alluded to above, the first pattern 36 and the second pattern 38 are concurrently etched in the interlayer dielectric layer 30 through the first hard mask pattern and the second hard mask pattern, thereby promoting uniform etching in the interlayer dielectric layer 30 while maximizing process efficiency. As a result, the first pattern 36 and the second pattern 38 are generally etched to equal depths within the interlayer dielectric layer 30 as shown generally in FIG. 5. As set forth above, the interlayer dielectric layer 30 may include separate layers 31, 32, 33 including different materials that have different etch rates in different etchants, and selection of particular materials can be employed to control etching of the interlayer dielectric layer 30. For example, in an embodiment and as shown in FIG. 5, one of the separate layers 31, 32, 33 included in the interlayer dielectric layer 30 is an etch stop layer 32, which may be employed to isolate etching of the first pattern 36 and the second pattern 38 to equal depths within the interlayer dielectric layer 30. In this embodiment, the etch stop layer 32 includes a material, such as a nitrogen-containing silicon material, and the etch stop layer 32 is spaced from the hard mask 34 by another separate layer 31 in the interlayer dielectric layer 30 that has a materially different etch rate in nitride etchants than the etch stop layer 32, such as an oxide. The etch stop layer 32 may be thinner than the hard mask 34 to enable eventual etching through the etch stop layer 32 without completely removing the hard mask 34. Etching the interlayer dielectric layer 30 through the first hard mask pattern and the second hard mask pattern may be conducted in the same manner as described above for etching the protecting layer and the dielectric layer that is immediately beneath the protecting layer for purposes of forming via holes during formation of the at least one through-semiconductor via 22. However, it is to be appreciated that suitable integration schemes are not limited to the preceding examples.

At least one interconnect via 42 is embedded within the interlayer dielectric layer 30 to establish an electrical connection to the through-semiconductor via 22, as shown in FIG. 6. In embodiments, and as also shown in FIG. 6, a plurality of interconnect vias 42 is embedded within the interlayer dielectric layer 30, with dielectric material of the interlayer dielectric layer 30 insulating the interconnect vias 42 from each other. In an embodiment, the plurality of interconnect vias 42 is in electrical communication with one of the plurality of through-semiconductor vias 22, i.e., each through-semiconductor via 22 may have a plurality of interconnect vias 42 associated therewith. By providing the plurality of interconnect vias 42 associated with each of the through-semiconductor vias 22, robust electrical connection to the through-semiconductor vias 22 is assured and incidence of device failure attributable to incomplete connection of one or more individual interconnect vias 42 to the corresponding through-semiconductor via 22 is minimized.

In an embodiment and as shown in FIG. 5, to form the at least one interconnect via, at least one interconnect hole 44 is etched through the interlayer dielectric layer 30 in at least one of the first pattern 36 or the second pattern 38 to expose a surface 46 of the through-semiconductor via 22 in the at least one interconnect hole 44. In an embodiment, at least one interconnect hole 44 is etched in the first pattern 36 and at least one interconnect hole 44 is etched in the second pattern 38, thereby providing for subsequent interconnect via formation corresponding to both the first pattern 36 and the second pattern 38. In the embodiment shown in FIG. 5, the at least one interconnect hole 44 is formed by patterning the etch stop layer 32 in portions of the etch stop layer 32 that are exposed in the first pattern 36 and/or the second pattern 38 and that overlie the at least one through-semiconductor via 22, followed by etching through any remaining separate layers 33 of the interlayer dielectric layer 30 that are beneath the etch stop layer 32 to expose the surface 46 of the through-semiconductor via 22. Alternatively, although not shown, gaps (not shown) in a configuration of the interconnect holes 44 may be pre-patterned in the etch stop layer 32 prior to forming subsequent separate layers 31 of the interlayer dielectric layer 30 over the etch stop layer 32. In this embodiment, during etching of the interlayer dielectric layer 30 through the first pattern 36 and the second pattern 38 in the hard mask 34, etching may propagate through the gaps in the etch stop layer 32 that are exposed in the first pattern 36 and the second pattern 38 to effectively provide for interconnect hole formation concurrently with etching of the first pattern 36 and the second pattern 38 in the interlayer dielectric layer 30. However, it is to be appreciated that suitable integration schemes are not limited to the preceding examples.

As shown in FIG. 6, a metal-containing material is deposited in the first pattern 36 and the second pattern 38 to form a first metal layer 48 that is in electrical communication with at least one interconnect via 42. The first metal layer 48, as referred to herein, is the layer formed after filling the first pattern 36 and the second pattern 38 with the metal-containing material, as distinguished from the interconnect vias 42 that establish electrical communication between the at least one through-semiconductor via 22 and the first metal layer 48. The metal-containing material includes, but is not limited to, material that only includes metal such as copper, tungsten, aluminum, silver, gold, other metals, or alloys thereof, and it is to be appreciated that components other than metals may be present in the metal-containing material provided that the first metal layer 48 is capable conducting electricity. In an embodiment, the at least one interconnect via 42 is embedded in the interlayer dielectric layer 30 by concurrently filling the at least one interconnect hole along with depositing the metal-containing material in the first pattern 36 and the second pattern 38. In this manner, robust connection between the first metal layer 48 and the at least one interconnect via 42 is possible, although it is to be appreciated that, in other embodiments, the at least one interconnect via 42 may be formed prior to forming the first metal layer 48.

Although not shown in the figures, it is to be appreciated that additional interlayer dielectric layers and additional metal layers may be formed over the first metal layer 48 in accordance with known fabrication techniques for integrated circuits. It is also to be appreciated that additional structure may be present below the semiconductor substrate 14 shown in FIGS. 1-6, although no such additional structures are shown. Furthermore, numerous repeating structures as shown in FIGS. 1-6 can be stacked in the integrated circuit 10 to establish electrical connections through the through-semiconductor vias 22.

Specific embodiments will now be described for different first pattern 36 and second pattern 38 configurations that may be formed in accordance with the methods described herein, with reference to FIGS. 7-9 for the respective embodiments. FIGS. 7-9 illustrate top views of integrated circuits 710, 810, 910 focused over a single through-semiconductor via 22 thereof, after etching the first pattern and etching the second pattern in the interlayer dielectric layer, and also after etching interconnect holes in the interlayer dielectric layer that expose the surface of the through-semiconductor via. In an embodiment and as shown in FIG. 7, the first pattern 736 and the second pattern 738 are etched over at least one common area of the at least one through-semiconductor via 22 in the integrated circuit 710, meaning that the first pattern 736 and the second pattern 738 partially overlap at overlapping portions 750. By partially overlapping the first pattern 736 and the second pattern 738, intricate patterning details can be produced that may be particularly useful as aspect ratios continually decrease. Further, complete etching in overlapping portions 750 of the first pattern 736 and the second pattern 738 ensures that the interconnect holes 744 are properly formed in the overlapping portions 750 such that at least some of the interconnect vias will be properly formed upon filling the interconnect holes 744 with the metal-containing material. In this regard, in an embodiment and as shown in FIG. 7, the overlapping portions 750 of the first pattern 736 and the second pattern 738 are regularly arranged across an area of the interlayer dielectric layer 30 that overlies the at least one through-semiconductor via 22, thereby ensuring robust formation of the interconnect vias across the through-semiconductor via 22. Although not shown in FIG. 7, subsequent deposition of the metal-containing material in the first pattern 736 and the second pattern 738 forms the first metal layer in the first pattern 736 and the second pattern 738 in direct physical contact at the overlapping portions 750 of the first pattern 736 and the second pattern 738.

In other embodiments and as shown in FIGS. 8 and 9, the first pattern and the second pattern are only etched over different interconnect vias of the plurality of interconnect vias. In this regard, the first pattern and the second pattern are isolated from each other and are free of overlapping portions, with the metal-containing material that is deposited in the first pattern and the second pattern forming the first metal layer that has regions separated from direct physical contact by dielectric material of the interlayer dielectric layer. For example, in an embodiment and as shown in FIG. 8, the first pattern 836 defines gaps in the first pattern 836, and the second pattern 838 is etched in the gaps that are formed within the first pattern 836. Although the first pattern 836 as shown in FIG. 8 illustrates a cross-hatch pattern, with the second pattern 838 formed in gaps of the cross-hatch pattern, it is to be appreciated that the first pattern 836 can be configured in different ways to still define gaps within which the second pattern 838 is formed. The interconnect holes 844 may be formed in the manners described above. Forming the first pattern 836 and the second pattern 838 in the manner shown in FIG. 8 may hinder crack propagation within the interlayer dielectric substrate of the integrated circuit 810 while providing a robust connection between the first metal layer and the interconnect vias, thus ensuring proper operation of the integrated circuit 810. Further, the presence of portions of the interlayer dielectric substrate between regions of the first metal layer enables the first metal layer to be formed with consistent thickness while providing structural support during techniques such as CMP. Further still, the first metal layer that is formed in the first pattern 836 may be connected to a power source separate from the first metal layer in the second pattern 838, with a circuit completed through respective interconnect vias and through the through-semiconductor via 22. In this manner, testing can be conducted to determine whether specific interconnect vias are properly formed in the interlayer dielectric layer over the through-semiconductor via 22.

Referring now to the embodiment shown in FIG. 9, in this embodiment the first pattern 936 and the second pattern 938 are isolated to different regions of the through-semiconductor via 22 in the integrated circuit 910. In this embodiment, although not shown in FIG. 9, the at least one interconnect via includes at least one first interconnect via and at least one second interconnect via in the different regions corresponding to the first pattern 36 and the second pattern 38. The first interconnect vias and the second interconnect vias are associated with different portions of the first metal layer that is later formed. In an embodiment and as shown in FIG. 9, at least one first interconnect hole 954 and at least one second interconnect hole 956 are formed to facilitate later formation of the at least one first interconnect via and the at least one second interconnect via in the respective interconnect holes 956. As shown in FIG. 9, dielectric material of the interlayer dielectric layer 30 insulates the at least one first interconnect hole 954 and the at least one second interconnect hole 956 from each other. In this embodiment and as shown in FIG. 9, the first pattern 936 is etched overlying a first region of the at least one through-semiconductor via 22 and the second pattern 938 is etched overlying a second region of the at least one through-semiconductor via 22. The at least one first interconnect via is formed in the interlayer dielectric layer 30 overlying the first region of the at least one through-semiconductor via 22, and the at least one second interconnect via is formed in the interlayer dielectric layer 30 overlying the second region. Although not shown in FIG. 9, after forming the first pattern 36 and the second pattern 38 and also after forming the interconnect holes 954, 956, the metal-containing material is deposited in the first pattern 936 and the second pattern 938 to form a first portion of the first metal layer in direct electrical communication with the at least one first interconnect via and a second portion of the first metal layer in direct electrical communication with the at least one second interconnect via. Again, the first portion and the second portion of the first metal layer are insulated from direct electrical communication with each other. In this manner, the first metal layer that is formed in the first pattern 936 may be connected to a power source separate from the first metal layer in the second pattern 938, with a circuit completed through respective first interconnect vias and second interconnect vias through the through-semiconductor via 22. However, it is to be appreciated that suitable circuit applications are not limited to the preceding examples.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming an integrated circuit, the method comprising:
   forming a plurality of semiconductor devices on a semiconductor substrate;
   forming at least one through-semiconductor via in the semiconductor substrate;
   forming an interlayer dielectric layer overlying the at least one through-semiconductor via and the plurality of semiconductor devices, wherein the interlayer dielectric layer comprises an etch stop layer and a separate layer overlying the etch stop layer;
   etching a first pattern in the separate layer of the interlayer dielectric layer over the at least one through-semiconductor via to expose a portion of the etch stop layer in the first pattern;
   etching a second pattern different from the first pattern in the separate layer of the interlayer dielectric layer over the at least one through-semiconductor via to expose a portion of the etch stop layer in the second pattern, with the first pattern and the second pattern etched over the same through-semiconductor via;
   embedding at least one interconnect via within the interlayer dielectric layer, the at least one interconnect via in electrical communication with one of the at least one through-semiconductor vias; and
   depositing a metal-containing material in the first pattern and the second pattern to form a first metal layer in electrical communication with the at least one interconnect via;
   wherein embedding the at least one interconnect via within the interlayer dielectric layer comprises etching at least one interconnect hole through portions of the etch stop layer that are exposed in the first pattern and/or the second pattern and that overlie the at least one through-semiconductor via to expose a surface of the through-semiconductor via, wherein the at least one interconnect hole is etched after etching the first pattern and/or the second pattern.

2. The method of claim 1, wherein etching the at least one interconnect hole comprises etching at least one interconnect hole through the portion of the etch stop layer that is exposed in the first pattern and etching at least one interconnect hole through the portion of the etch stop layer that is exposed in the second pattern.

3. The method of claim 1, wherein embedding the at least one interconnect via comprises concurrently filling the at least one interconnect hole along with depositing the metal-containing material in the first pattern and the second pattern.

4. The method of claim 1, wherein etching the first pattern comprises patterning a hard mask overlying the interlayer dielectric layer to form a first hard mask pattern.

5. The method of claim 4, wherein etching the second pattern comprises patterning the hard mask to form a second hard mask pattern.

6. The method of claim 5, wherein etching the first pattern and etching the second pattern comprise concurrently etching the interlayer dielectric layer through the first hard mask pattern and the second hard mask pattern.

7. A method of forming an integrated circuit, the method comprising:
   forming a plurality of semiconductor devices on a semiconductor substrate;
   etching at least one via hole into the semiconductor substrate with the semiconductor substrate surrounding the at least one via hole, and with the at least one semiconductor device formed adjacent the at least one via hole;
   forming at least one through-semiconductor via in the at least one via hole in the semiconductor substrate;
   forming an interlayer dielectric layer overlying the at least one through-semiconductor via and the plurality of semiconductor devices, wherein the interlayer dielectric layer comprises an etch stop layer and a separate layer overlying the etch stop layer;
   etching a first pattern in the separate layer of the interlayer dielectric layer over the at least one through-semiconductor via to expose a portion of the etch stop layer in the first pattern; and
   etching a second pattern different from the first pattern in the separate layer of the interlayer dielectric layer over the at least one through-semiconductor via to expose a portion of the etch stop layer in the second pattern, with the first pattern and the second pattern etched over the same through-semiconductor via;
   etching at least one interconnect hole through the interlayer dielectric layer in portions of the etch stop layer that are exposed in at least one of the first pattern or the second pattern and that overlie the at least one through-semiconductor via;
   concurrently filling the at least one interconnect hole with a metal-containing material to form a plurality of interconnect vias and depositing the metal-containing material in the first pattern and the second pattern to form a first metal layer in electrical communication with the plurality of interconnect vias, the plurality of interconnect vias in electrical communication with one of the at least one through-semiconductor vias.

* * * * *